(12) United States Patent
Salls et al.

(10) Patent No.: US 11,428,729 B2
(45) Date of Patent: Aug. 30, 2022

(54) DEVICE FOR TESTING A PRINTED CIRCUIT BOARD

(71) Applicant: Teradyne, Inc., North Reading, MA (US)

(72) Inventors: Michael Salls, Chandler, AZ (US); Roger Good, Austin, TX (US)

(73) Assignee: TERADYNE, INC., North Reading, MA (US)

( * ) Notice: Subject to any disclaimer, the term of this patent is extended or adjusted under 35 U.S.C. 154(b) by 175 days.

(21) Appl. No.: 16/749,652

(22) Filed: Jan. 22, 2020

(65) Prior Publication Data

US 2021/0223309 A1    Jul. 22, 2021

(51) Int. Cl.
*G01R 31/28*    (2006.01)
*G01R 1/04*    (2006.01)
*G01R 1/067*    (2006.01)
*G01R 1/073*    (2006.01)

(52) U.S. Cl.
CPC ............................... *G01R 31/2808* (2013.01)

(58) Field of Classification Search
CPC ............ G01R 31/28; G01R 31/2889; G01R 31/2834; G01R 31/2818; G01R 1/04; G01R 1/0408; G01R 1/0491; G01R 1/067; G01R 1/073
See application file for complete search history.

(56) References Cited

U.S. PATENT DOCUMENTS

| | | | |
|---|---|---|---|
| 3,795,884 A | 3/1974 | Kotaka | |
| 5,954,529 A | 9/1999 | Meller | |
| 9,164,158 B2 | 10/2015 | Johnson et al. | |
| 9,980,367 B2 | 5/2018 | Perng et al. | |
| 11,165,188 B2 | 11/2021 | Carle | |
| 2005/0150194 A1* | 7/2005 | Okamuro | B65D 19/44 53/494 |
| 2013/0063172 A1* | 3/2013 | Hsu | G01R 1/07314 324/754.09 |
| 2015/0144915 A1* | 5/2015 | Lee | G09G 3/006 257/40 |

* cited by examiner

*Primary Examiner* — Neel D Shah
(74) *Attorney, Agent, or Firm* — Burns & Levinson LLP

(57) ABSTRACT

An example apparatus includes a block configured to connect mechanically to a circuit board. The circuit board includes a first conductive path running to a first electrical contact on the circuit board and a second conductive path running to a second electrical contact on the circuit board. The first electrical contact and the second electrical contact are arranged in an area of the circuit board. The block includes a component having a surface that is configured to cover at least part of the area. A conductive layer is attached to at least part of the surface. The conductive layer is for creating a short circuit between the first electrical contact and the second electrical contact following connection of the block to the circuit board.

20 Claims, 3 Drawing Sheets

DEVICE FOR TESTING A PRINTED CIRCUIT BOARD

TECHNICAL FIELD

This specification describes examples of devices for testing a printed circuit board (PCB).

BACKGROUND

An example printed circuit board (PCB) includes one or more layers of metal arranged among layers of a non-conductive substrate. The metal forms conductive traces, together with inter-layer vias, through which electrical signals may pass. A PCB typically also includes electrical contacts on surfaces thereof to enable external devices to connect electrically to the conductive traces in the PCB.

SUMMARY

An example apparatus includes a block configured to connect mechanically to a circuit board. The circuit board includes a first conductive path running to a first electrical contact on the circuit board and a second conductive path running to a second electrical contact on the circuit board. The first electrical contact and the second electrical contact are arranged in an area of the circuit board. The block includes a component having a surface that is configured to cover at least part of the area. A conductive layer is attached to at least part of the surface. The conductive layer is for creating a short circuit between the first electrical contact and the second electrical contact following connection of the block to the circuit board. The apparatus may include one or more of the following features, either alone or in combination.

Tape may attach the conductive layer to the at least part of the surface of the component. The tape may be electrically insulating. The block may be made of a first metal and the conductive layer may be made of a second metal. The second metal may be softer than the first metal such that the connection of the block to the circuit board causes an imprint of the first electrical contact and the second electrical contact on the conductive layer. The block may be or include aluminum. The block may be or include multiple layers of three-dimensional-printed material. The conductive layer may be or include copper. The first electrical contact may be a signal contact and the second electrical contact may be an electrical ground contact. The block may include multiple legs to implement mechanical connections to the circuit board. The component may be arranged among the multiple legs.

An example test system includes a test instrument configured to force at last one of voltage or current and a circuit board connected to the test instrument. The circuit board may include electrical contacts including a first electrical contact and a second electrical contact. The circuit board may include a first conductive path to the first electrical contact and a second conductive path to the second electrical contact. The first conductive path and the second conductive path may be parts of electrical connections between the circuit board and the test instrument. A device may be electrically connected to the first electrical contact and the second electrical contact to create a short circuit between the first electrical contact and the second electrical contact. The device may include a block configured to connect mechanically to the circuit board. The block may be a component having a surface that is configured to cover at least an area over the first electrical contact and the second electrical contact. A conductive layer may be attached to at least part of the surface. The conductive layer may be for creating the short circuit between the first electrical contact and the second electrical contact following connection of the block to the circuit board. The test system may include one or more of the following features, either alone or in combination.

The device may include tape to attach the conductive layer to the at least part of the surface. The tape may be electrically insulating. The block may be made of a first metal and the conductive layer may be made of a second metal. The second metal may be softer than the first metal such that the connection of the block to the circuit board causes an imprint of the first electrical contact and the second electrical contact on the conductive layer.

The circuit board may be connected directly to the test instrument. The circuit board may be connected to the test instrument via one or more intermediary structures located between the circuit board and the test instrument. The circuit board may be a device interface board (DIB). The DIB may be for holding devices under test that mate to the electrical contacts. The circuit board may include a probe card to contact devices under test physically and electrically.

The test instrument may include one or more processing devices to execute a test program to perform operations that include forcing current over the first conductive path and measuring voltage between the first conductive path and the second conductive path following forcing the current. The operations may include setting a clamp voltage to a pre-defined value and determining whether the voltage measured exceeds the clamp voltage. The operations may include determining a path resistance based on the current and the voltage measured. The path resistance may be a resistance that includes the first conductive path, the second conductive path, and the short circuit between the first conductive path and the second conductive path. The operations may include determining a path capacitance based, in part, on the current and the voltage measured. The path capacitance may be a capacitance that includes the first conductive path, the second conductive path, and the short circuit between the first conductive path and the second conductive path.

The electrical contacts on the circuit board may include a third electrical contact. The circuit board may include a third conductive path to the third electrical contact. The third conductive path may be part of an electrical connection between the circuit board and the test instrument. The operations performed by the one or more processing devices may include forcing current over the first conductive path and measuring a first electrical parameter between the first conductive path and the second conductive path following forcing the current; forcing current over the third conductive path and measuring a second electrical parameter between the third conductive path and the second conductive path following forcing the current; and identifying a location of a defect in the circuit board based on the first electrical parameter and the second electrical parameter.

Any two or more of the features described in this specification, including in this summary section, may be combined to form implementations not specifically described in this specification.

At least part of the test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Figure 1:
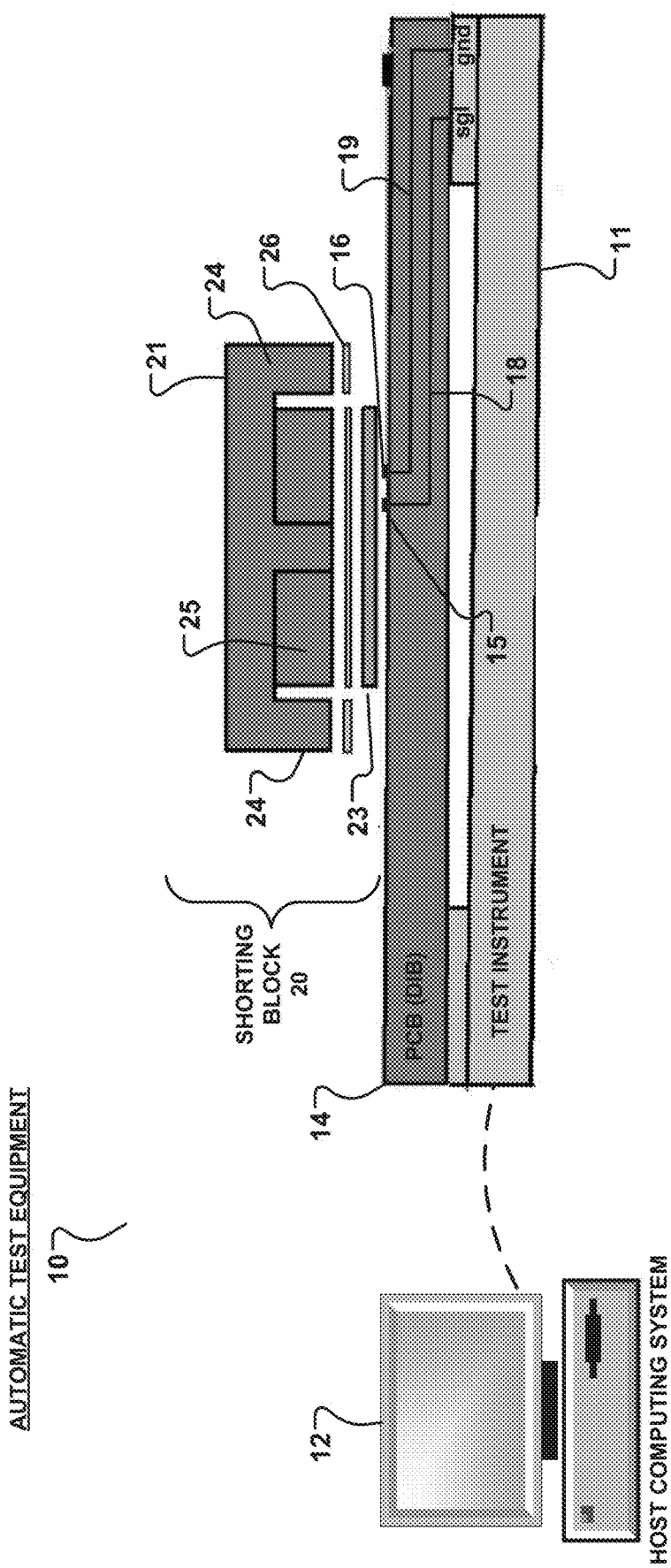
FIG. 1 is a block diagram showing a side view of a test system and an exploded side view of a shorting block for testing a printed circuit board.

Described herein are example implementations of systems and techniques for testing the electrical characteristics of a printed circuit board (PCB). Examples of PCBs that may be tested include, but are not limited to, a device interface board (DIB) and a prober interface board (PIB). These types of PCBs are used in test systems for testing devices under test (DUTs). However, the systems and techniques are not limited to use with test-related PCBs and may be employed to test any appropriate type of PCB.

PCBs include conductive paths to pass signals between two endpoints. For example, a DIB contains conductive traces and/or interconnecting vias to pass signals between a test instrument and a DUT. A PIB contains conductive traces and/or interconnecting vias to pass signals between a test instrument and a probe card. The conductive traces and vias are comprised of electrically conductive material. Electrical characteristics of the conductive paths can affect the quality of the signals that are passed through the PCB. Testing a PCB, however, can be difficult if devices are connected to a PCB. For example, it may be difficult to test a DIB if a DUT is connected to the DIB. Removing the DUT from the DIB for testing can damage the DIB. Accordingly, the systems and techniques described herein are configured to test a PCB prior to incorporating that PCB into a system or prior to connecting a DUT to the PCB. For example the systems and techniques may be used to test a DIB or a PIB prior to incorporating that DIB or PIB into a test system.

In some implementations, a PCB is connected, either directly or indirectly, to a test instrument. The PCB includes electrical contacts, conductive traces, and vias that form conductive paths between the PCB and the test instrument. For example, a first conductive path may run between a first electrical contact on a DIB and the test instrument. A second conductive path may run between a second electrical contact on the DIB and an electrical reference, such as electrical ground. A PCB testing device is electrically connectable to the first electrical contact and to the second electrical contact to create a short circuit between the first electrical contact and the second electrical contact and thus between a signal path and ground. The device may include a block that is configured to connect mechanically to the circuit board. The block may include a component having a surface that is configured to cover at least an area over the first electrical contact and the second electrical contact. The device may also include a conductive layer attached to at least part of the surface. In this example, the conductive layer is for creating the short circuit between the first electrical contact and the second electrical contact following connection of the block to the circuit board.

An example of the device described in the preceding paragraph may be referred to as a "shorting block". In this regard, an example DUT may include power pins, digital pins, analog pins, and a ground pin. The shorting block may be used to create an electrical short circuit between electrical contacts—for example, DUT pads—on a PCB to which the DUT would normally connect. The shorting block may create an electrical short circuit between electrical contacts for the power pins, digital pins, and/or analog pins and the electrical contact for the ground pin. As a result, it is possible to form an uninterrupted conductive path from a test instrument through the PCB and its components to the electrical contacts and then to electrical ground. The conductive path may include the electrical contacts on the surface of the PCB and one or more surface and/or internal conductive traces and/or one or more vias between circuit board layers. The test instrument may be calibrated to points of the electrical contacts for the power pins, digital pins, and analog pins and to the electrical contact for the ground pin to produce a standard measurement path for verifying characteristics of the PCB and components, if any, connected to the PCB. To protect the electrical contacts from damage, the shorting block may include a thin electrically-conductive film, such as copper adhesive, that interfaces directly to the electrical contacts. In addition, the thin electrically-conductive film also enables an end user to verify impressions of the electrical contacts on the film after the shorting block connects to the PCB. For example, the impressions may be of DUT pads that are imprinted onto the copper adhesive in response to pressure applied to the shorting block.

After the connection is made between the PCB testing device—for example, the shorting block—and the circuit board, testing may be performed by forcing current, voltage, or both current and voltage from the test instrument. For example, the test instrument may include a processing system, which may include one or more processing devices, to execute a test program to perform parametric testing on the PCB. The test program may include operations such as forcing current over a first conductive path to the PCB and measuring voltage between the first conductive path and a second conductive path connected to electrical ground after the current is forced. By forcing the current and/or voltage, the test instrument can determine the resistance of a conductive path, the capacitance of the conductive path, the inductance of the conductive path, the capacitive reactance of the conductive path, the inductive reactance of the conductive path, and any other appropriate PCB or "board" parameters that are discernible by performing voltage and current measurements across the PCB.

FIG. 1 shows components of example automatic test equipment (ATE) 10. ATE 10 includes a test instrument 11 and a host computing system 12. The host computing system is a control system in this example. The host computing system may include a computing system comprised of one or more microprocessors or other appropriate processing devices as described herein. Host computing system 12 may send to the test instrument instructions, test data, and/or other information that are usable by the test instrument to perform appropriate tests on the DIB or on DUTs interfaced to the DIB. In some implementations, this information may be sent via a computer or other type of network or via a direct electrical path. In some implementations, this information may be sent via a local area network (LAN) or a wide area network (WAN).

The test instrument may be configured to output test signals based, for example, on test data and/or information provided by the host computing system, and to receive response signals through the DIB. Different test instruments may be configured to perform different types of tests and/or be configured to test different PCBs or DUTs. The received signals may include response signals that are based on the test signals and/or signals that originate from the DUT that are not prompted by (e.g., are not in response to) test signals.

In the example of FIG. 1, a DIB 14 includes a PCB that is connected to test instrument 11. DIB 14 also includes mechanical and electrical connections to one or more DUTs to be tested by the ATE. Although FIG. 1 shows the DIB connecting directly to the test instrument via spring-loaded pogo pins (not labeled), in some implementations there may be one or more structures, such as an interposer board or an interconnect board, between the DIB and the test instrument. So, connection between the DIB and the test instrument may be direct as shown or it may be indirect.

The DIB includes sites, to which the DUTs may electrically and mechanically connect. The sites include electrical contacts 15 and 16 for electrically connecting DUTs to the DIB. Examples of these electrical contacts include DUT pads, to which a DUT may be connected using solder, for example. The DIB may include conductive traces 18 and 19 that run to, and connect electrically to, the electrical contacts. The conductive traces may be internal to the PCB or on a surface of the PCB. The DIB may include one or more vias to pass signals between layers of the PCB. Electrical connections formed over the resulting conductive paths (for example, an electrical contact in combination with one or more conductive traces and/or one or more vias) allow signals to pass between a DUT and test instrument 11 on the ATE.

As noted above, at least one of the electrical contacts connects to electrical ground. In the example of FIG. 1, DIB 14 includes electrical contact 15 for transmitting signals ("sgl") between test instrument 11 and a DUT and electrical contact 16 for connecting a ground pin on the DUT to electrical ground ("gnd"). Although one electrical contact 15 is shown in FIG. 1 for transmitting signals between test instrument 11 and a DUT (not shown), the DIB may include multiple electrical contacts and corresponding conductive paths connected to those electrical contacts for transmitting signals between test instrument 11 and a DUT. In addition, in some implementations, the DIB may include multiple electrical contacts and corresponding conductive paths for connecting ground pins on the DUT to electrical ground Test signals, response signals, and other signals pass between the DUTs and the test instrument via test channels through the DIB. DIB 14 may also include, among other things, connectors, conductive traces, vias, and circuitry for routing signals between the test instruments, DUTs connected to the DIB, and other circuitry. For example, the DIB may include one or more passive electrical devices, such as capacitors, resistors, or inductors. For example, the DIB may include one or more active electrical devices, such as transistors or rectifiers. One or more passive electrical devices and/or one or more active electrical devices may be part of an electrical connection/conductive path formed between a DUT and the test instrument.

Figure 2:
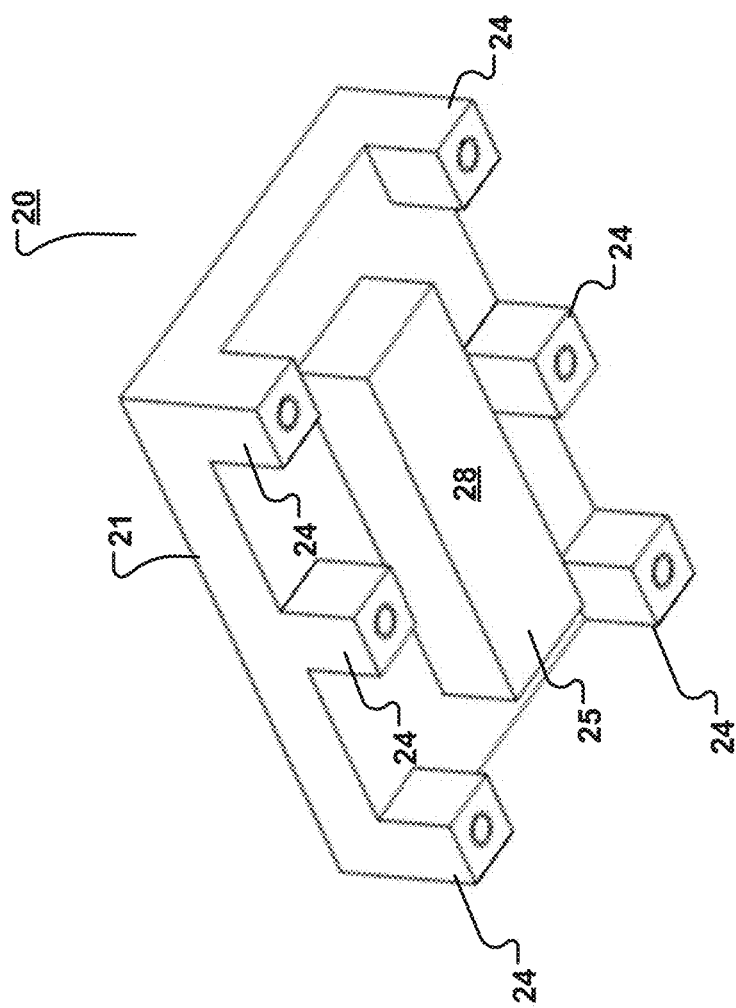
FIG. 2 is a diagram showing a perspective view of the shorting block of FIG. 1.

As shown in FIG. 1, device 20—the shorting block—is configured to connect electrically to electrical contact 15 and electrical contact 16 to create a short circuit between electrical contact 15 and electrical contact 16. Referring also to FIG. 2, device 20 includes a block 21. In this example, block 21 is made of aluminum; however, any appropriate material may be used. For example, three-dimensionally (3D) printed resin may be used to form the block; other metals may be used to form the block; and/or polymers may be used to form the block. In this example, block 21 includes multiple legs 24 to form mechanical connections to DIB 14. The legs may include holes as shown that correspond to locations on the DIB (or other PCB) where a mount socket or probe head connects to the DIB. Mechanical connectors, such as pins, may attach the legs to the DIB via the holes.

Block 21 also includes a component 25 that is arranged among the legs 24. The component has the shape of a rectangular cuboid—that is, a three-dimensional orthotope—in this example; however, other shapes may be used. For example, the component may be cubical or cylindrical. In the example of FIGS. 1 and 2, component 25 includes a surface 28 having an area that is large enough to cover at least an area containing electrical contacts 15 and 16. This configuration enables device 20 to create a short circuit between electrical contacts 15 and 16.

In this example, device 20 includes a conductive layer 23 attached directly or indirectly to at least part of a surface 28 (FIG. 2) of component 25. The conductive layer is used to create the short circuit between electrical contacts 15 and 16 following connection of device 20 to the circuit board. The conductive layer may be made of a different material than the block. For example, the conductive layer may be made of, or include, a metal that is softer than the metal or other material contained in block 2. In some implementations, the block may be made of aluminum and the conductive layer may be made of copper. The softness of the copper results in an imprint of electrical contacts 15 and 16 onto the conductive layer following connection of device 20 to the circuit board. For example, the pressure causing the connection produces the imprint. This can be advantageous because it enables a user to verify locations of the electrical contacts. In addition, the softness of the conductive layer may reduce the chances that the electrical contacts will be damaged when the device is used.

In some implementations, adhesive tape 26 is between conductive layer 23 and component 25. Adhesive tape 26 may also be between legs 24 and the PCB, as shown. The adhesive tape may assist in maintaining connection between device 20 and DIB 14. In some implementations, the adhesive tape may be Kapton® insulation tape. Kapton® insulation tape includes polyimide film with silicone adhesive. Other types of tape, however, may be used. In some implementations, the tape may be omitted, for example in cases where the block is made of non-conductive material.

In some implementations, both the adhesive tape and the conductive layer may be omitted from device 20. For example, block 21 may be made of conductive material and itself may create the short circuit between electrical contacts 15 and 16. For example, block 21 may be made of relatively soft copper or other appropriate metal.

Figure 3:
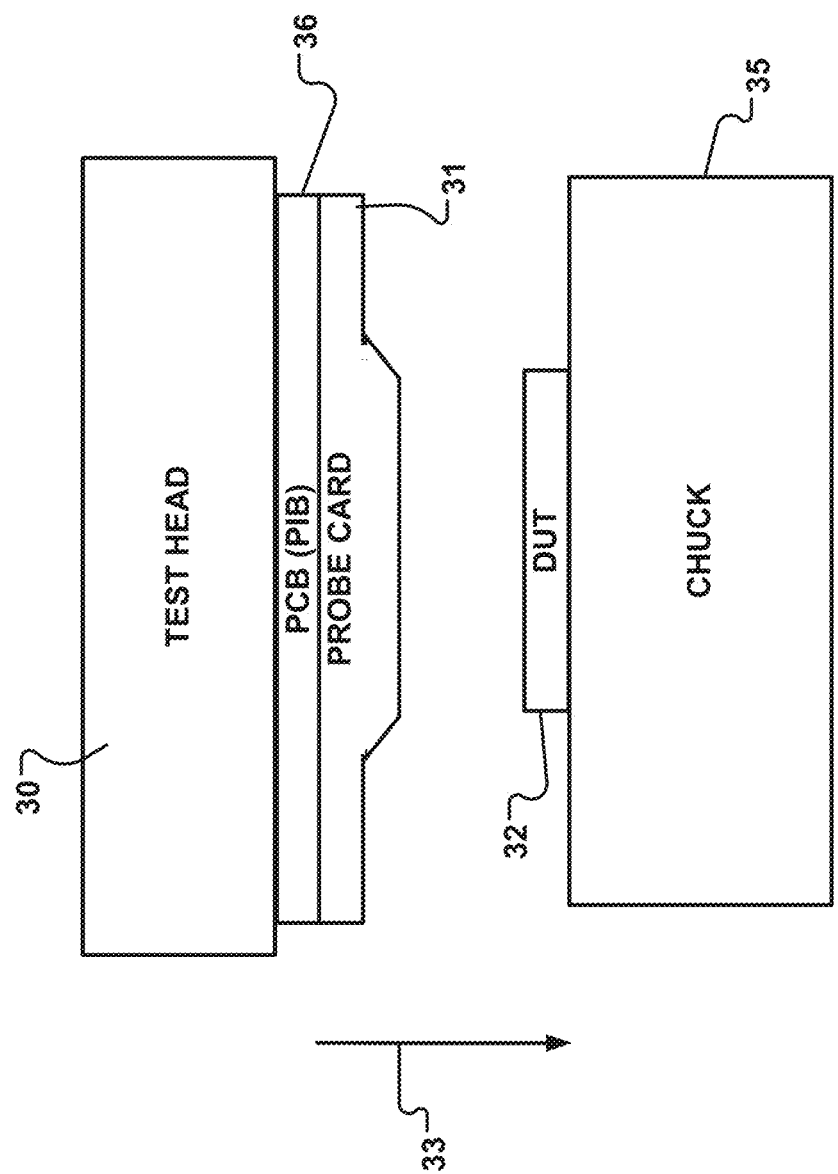
FIG. 3 is a block diagram showing a side view of an alternate test system containing a printed circuit board that may be tested using the shorting block.

In the example of FIG. 1, the PCB is a DIB. In other examples, the PCB may be a PIB. A PIB acts as the interface between a probe card tester and the probe card. In a probe card tester, such as that shown in FIG. 3, a test head 30 contains test electronics. A probe card 31 contacts a DUT 32, such as a wafer or integrated circuits located on a chuck 35, through movement in the direction of arrow 33. A PIB 36 may include electrical contacts and conductive paths as described previously with respect to the DIB. Device 20 of FIGS. 1 and 2 may also be used to create an electrical short circuit between electrical contacts on the PIB in the manner described herein to test the PIB.

To test a PCB such as a PIB or a DIB using device 20, the test instrument may execute a test program. The test program may instruct circuitry in the test instrument, such as a per-pin measurement unit (PPMU) to force current over a first conductive path and to measure voltage between the first conductive path and a second conductive path following forcing the current. For example, the test instrument 11 may force current over a path containing conductive trace 18. The short circuit created by device 20 between electrical contacts 15 and 16 creates a conductive path that causes the current to flow to ground through conductive trace 19. The test instrument may then measure a value of the voltage across the conductive path that device 20 creates. For example, the test instrument may set a clamp voltage to a predefined value and determine whether the voltage measured exceeds the clamp voltage. In an example operation, the test instrument forces 100 μA (microamperes) of current and sets the clamp voltage at 10 mV (millivolts) or 50 mV. The current and voltage may be used to determine a resistance over the first conductive path, the second conductive path, and the short circuit between the first conductive path and the second conductive path. If the clamp voltage or a predefined resistance is exceeded, the test instrument may inform the computing system that there is a problem with the PCB.

In some implementations, the test instrument may be configured to determine a capacitance over the first conductive path, the second conductive path, and the short circuit between the first conductive and the second conductive path. The capacitance is based, in part, on the current and the voltage measured. The test instrument may also be configured to determine the inductance of the conductive path, the capacitive reactance of the conductive path, the inductive reactance of the conductive path, and any other appropriate parameters that can be determined by forcing voltage and/or current. Values for one or more of these parameters may be compared to predefined tolerances for the PCB. If one or more of those tolerances are exceeded, the test instrument may inform the computing system that there is a problem with the PCB.

An example test protocol may include attaching device 20—the shorting block—to a PCB. Any relays or active components within the conductive path to be tested may be energized. The test instrument is connected to the PCB. Test instrument parameter setup conditions are set. In example, the clamp voltage may be set to 1V, the current range may be set to 200 uA, and the force current may be set to 100 uA. The current is then forced out over a conductive path and a voltage over the conductive path is measured. Calculations may then be performed using the forced current and measured voltage to determine parameters, such as resistance, capacitance, and so forth.

In some implementations, by forcing current and limiting the current available to a DUT pogo pad, it is possible to prevent damage to the test instrument. The voltage clamp may be set to prevent a maximum swing when a discontinuity condition occurs. When a good conductive path is encountered, a minute amount of voltage change is measured, which can be translated into a resistance value using Ohms Law. For example a forced 100 uA current and a voltage measurement of 50 mV translates to a resistance of 500Ω (Ohms) of conductive path resistance (plus component resistance) within a test path. An additional parametric test can be performed also to verify conductive path capacitance values by using the resistance measured along with PCB design parameters such as trace widths, trace lengths, trace thickness, and dielectric constants of the material used in the PCB.

In some implementations, device 20 may be used to isolate the locations of faults on a PCB. For example, device 20 may be placed over three electrical contacts on a PCB, one of which is to ground and two of which are signal contacts. In this case, testing may include forcing current over a first conductive path and measuring a first electrical parameter across the first conductive path and a second conductive path following forcing the current; forcing current over a third conductive path and measuring a second electrical parameter across the third conductive path and the second conductive path following forcing the current; and identifying a location of a defect in the circuit board based on the first electrical parameter and the second electrical parameter. By comparing the first and second parameters, which may be measured voltage or conductive path resistance for example, it is possible to identify the location of one or more faults on the PCB.

All or part of the test systems and processes described in this specification and their various modifications may be configured or controlled at least in part by one or more computers such as host computing system 12 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test systems and processes can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. An apparatus comprising:
   a block configured to connect mechanically to a circuit board, the circuit board comprising a first conductive path running to a first electrical contact on the circuit board and a second conductive path running to a second electrical contact on the circuit board, the first electrical contact and the second electrical contact being arranged in an area of the circuit board, the block comprising a component having a surface that is configured to cover at least part of the area;
   a conductive layer attached to at least part of the surface, the conductive layer for creating a short circuit between the first electrical contact and the second electrical contact following connection of the block to the circuit board; and
   tape to attach the conductive layer to the at least part of the surface, the tape being electrically insulating.

2. An apparatus comprising:
   a block configured to connect mechanically to a circuit board, the circuit board comprising a first conductive path running to a first electrical contact on the circuit board and a second conductive path running to a second electrical contact on the circuit board, the first electrical contact and the second electrical contact being arranged in an area of the circuit board, the block comprising a component having a surface that is configured to cover at least part of the area; and
   a conductive layer attached to at least part of the surface, the conductive layer for creating a short circuit between the first electrical contact and the second electrical contact following connection of the block to the circuit board;
   wherein the block is made of a first metal and the conductive layer is made of a second metal comprising copper, the second metal being softer than the first metal such that the connection of the block to the circuit board causes an imprint of the first electrical contact and the second electrical contact on the conductive layer.

3. The apparatus of claim 2, wherein the block has multiple legs to implement mechanical connections to the circuit board; the component being arranged among the multiple legs.

4. An apparatus comprising:
   a block configured to connect mechanically to a circuit board, the circuit board comprising a first conductive path running to a first electrical contact on the circuit board and a second conductive path running to a second electrical contact on the circuit hoard, the first electrical contact and the second electrical contact being arranged in an area of the circuit board, the block comprising a component having a surface that is configured to cover at least part of the area; and
   a conductive layer attached to at least part of the surface, the conductive layer for creating a short circuit between the first electrical contact and the second electrical contact following connection of the block to the circuit board;
   wherein the block comprises aluminum; and
   wherein the block has multiple legs to implement mechanical connections to the circuit board, the component being arranged among the multiple legs.

5. An apparatus comprising:
   a block configured to connect mechanically to a circuit board, the circuit board comprising a first conductive path running to a first electrical contact on the circuit board and a second conductive path running to a second electrical contact on the circuit hoard, the first electrical contact and the second electrical contact being arranged in an area of the circuit board, the block comprising a component having a surface that is configured to cover at least part of the area; and
   a conductive layer attached to at least part of the surface, the conductive layer for creating a short circuit between the first electrical contact and the second electrical contact following connection of the block to the circuit board;
   wherein the conductive layer comprises copper; and
   wherein the block has multiple legs to implement mechanical connections to the circuit board, the component being arranged among the multiple legs.

6. The apparatus of claim 5, wherein the block comprises multiple layers of three-dimensional-printed material.

7. The apparatus of claim 5, wherein the first electrical contact comprises a signal contact and the second electrical contact comprises an electrical ground contact.

8. A test system comprising:
   a test instrument configured to force at last one of voltage or current;
   a circuit board connected to the test instrument, the circuit board comprising electrical contacts including a first electrical contact and a second electrical contact, the circuit board comprising a first conductive path to the first electrical contact and a second conductive path to the second electrical contact, the first conductive path and the second conductive path being parts of electrical connections between the circuit board and the test instrument; and
   a device that is electrically connected to the first electrical contact and the second electrical contact to create a short circuit between the first electrical contact and the second electrical contact, the device comprising:
      a block configured to connect mechanically to the circuit board, the block comprising a component having a surface that is configured to cover at least an area over the first electrical contact and the second electrical contact; and
      a conductive layer attached to at least part of the surface; the conductive layer for creating the short circuit between the first electrical contact and the second electrical contact following connection of the block to the circuit board;
   wherein the circuit board is connected directly to the test instrument.

9. A test system comprising:
   a test instrument configured to force at last one of voltage or current;

a circuit board connected to the test instrument, the circuit board comprising electrical contacts including a first electrical contact and a second electrical contact, the circuit board comprising a first conductive path to the first electrical contact and a second conductive path to the second electrical contact, the first conductive path and the second conductive path being parts of electrical connections between the circuit board and the test instrument; and a device that is electrically connected to the first electrical contact and the second electrical contact to create a short circuit between the first electrical contact and the second electrical contact, the device comprising:
   a block configured to connect mechanically to the circuit board, the block comprising a component having a surface that is configured to cover at least an area over the first electrical contact and the second electrical contact; and
   a conductive layer attached to at least part of the surface; the conductive layer for creating the short circuit between the first electrical contact and the second electrical contact following connection of the block to the circuit board;
wherein the circuit board is connected to the test instrument via one or more intermediary structures located between the circuit board and the test instrument.

10. The test system of claim 9, wherein the device comprises tape to attach the conductive layer to the at least part of the surface, the tape being electrically, insulating.

11. The test system of claim 9, wherein the block is made of a first metal and the conductive layer is made of a second metal, the second metal being softer than the first metal such that the connection of the block to the circuit board causes an imprint of the first electrical contact and the second electrical contact on the conductive layer.

12. A test system comprising:
a test instrument configured to force at last one of voltage or current;
a circuit board connected to the test instrument, the circuit board comprising electrical contacts including a first electrical contact and a second electrical contact, the circuit board comprising a first conductive path to the first electrical contact and a second conductive path to the second electrical contact, the first conductive path and the second conductive path being parts of electrical connections between the circuit board and the test instrument; and
a device that is electrically connected to the first electrical contact and the second electrical contact, to create a short circuit between the first electrical contact and the second electrical contact, the device comprising:
   a block configured to connect mechanically to the circuit board, the block comprising a component having a surface that is configured to cover at least an area over the first electrical contact and the second electrical contact; and
   a conductive layer attached to at least part of the surface, the conductive layer for creating the short circuit between the first electrical contact and the second electrical contact following connection of the block to the circuit board;
wherein the circuit board comprises a device interface board (DIB), the DIB for holding devices under test that mate to the electrical contacts.

13. The test system of claim 12, wherein the test instrument comprises one or more processing devices to execute a test program to perform operations that comprise forcing current over the first conductive path and measuring voltage between the first conductive path and the second conductive path following forcing the current.

14. The test system of claim 13, wherein the operations comprise setting a clamp voltage to a predefined value and determining whether the voltage measured exceeds the clamp voltage.

15. The test system of claim 13, wherein the operations comprise determining a path resistance based on the current and the voltage measured, the path resistance comprising a resistance that includes the first conductive path, the second conductive path, and the short circuit between the first conductive path and the second conductive path.

16. The test system of claim 13, wherein the operations comprise determining a path capacitance based, in part, on the current and the voltage measured, the path capacitance comprising a capacitance that includes the first conductive path, the second conductive path, and the short circuit between the first conductive path and the second conductive path.

17. The test system of claim 12, wherein the electrical contacts comprise a third electrical contact, the circuit board comprises a third conductive path to the third electrical contact, and the third conductive path is part of an electrical connection between the circuit board and the test instalment; and
wherein the operations comprise:
   forcing current over the first conductive path and measuring a first electrical parameter between the first conductive path and the second conductive path following forcing the current;
   forcing current over the third conductive path and measuring a second electrical parameter between the third conductive path and the second conductive path following forcing the current; and
   identifying a location of a defect in the circuit board based on the first electrical parameter and the second electrical parameter.

18. The test system of claim 12, wherein the device comprises tape to attach the conductive layer to the at least part of the surface, the tape being electrically, insulating.

19. The test system of claim 12, wherein the block is made of a first metal and the conductive layer is made of a second metal, the second metal being softer than the first metal such that the connection of the block to the circuit board causes an imprint of the first electrical contact and the second electrical contact on the conductive layer.

20. A test system comprising:
a test instrument configured to force at last one of voltage or current;
a circuit board connected to the test instrument, the circuit board comprising electrical contacts including a first electrical contact and a second electrical contact, the circuit board comprising a first conductive path to the first electrical contact and a second conductive path to the second electrical contact, the first conductive path and the second conductive path being parts of electrical connections between the circuit board and the test instrument; and
a device that is electrically connected to the first electrical contact and the second electrical contact to create a short circuit between the first electrical contact and the second electrical contact, the device comprising:
   a block configured to connect mechanically to the circuit board, the block comprising a component having a surface that is configured to cover at least an area over the first electrical contact and the second electrical contact; and a conductive layer attached to at least part of the surface; the conductive layer for creating the short circuit between the first electrical contact and the second electrical contact following connection of the block to the circuit board;

wherein the circuit board comprises a probe card to contact devices under test physically and electrically.

* * * * *

UNITED STATES PATENT AND TRADEMARK OFFICE
CERTIFICATE OF CORRECTION

| | |
|---|---|
| PATENT NO. | : 11,428,729 B2 |
| APPLICATION NO. | : 16/749652 |
| DATED | : August 30, 2022 |
| INVENTOR(S) | : Michael Salls et al. |

It is certified that error appears in the above-identified patent and that said Letters Patent is hereby corrected as shown below:

In the Claims

In Claim 4, Column 9, Line 65 please delete the word "hoard," and insert the word -- board, --.

In Claim 5, Column 10, Line 18 please delete the word "hoard," and insert the word -- board, --.

In Claim 10, Column 11, Line 29 please delete the word "electrically," and insert the word -- electrically --.

In Claim 12, Column 11, Line 49 please delete the word "contact," and insert the word -- contact --.

In Claim 17, Column 12, Line 26 please delete the word "instalment;" and insert the word -- instrument; --.

In Claim 18, Column 12, Line 43 please delete the word "electrically," and insert the word -- electrically --.

Signed and Sealed this
Eleventh Day of October, 2022

Katherine Kelly Vidal
*Director of the United States Patent and Trademark Office*